United States Patent
Tomita

[19]

[11] Patent Number: 5,825,703
[45] Date of Patent: Oct. 20, 1998

[54] SEMICONDUCTOR MEMORY DEVICE HAVING P-CHANNEL FIELD EFFECT TRANSISTOR TO DRIVE WORD LINE

[75] Inventor: Hiroyoshi Tomita, Kawasaki, Japan

[73] Assignee: Fujitsu Limited, Kanagawa, Japan

[21] Appl. No.: 959,529

[22] Filed: Oct. 24, 1997

Related U.S. Application Data

[63] Continuation of Ser. No. 622,297, Mar. 25, 1996, abandoned.

[30] Foreign Application Priority Data

Aug. 17, 1995 [JP] Japan .................................. 7-209389

[51] Int. Cl.⁶ ............................................... G11C 7/00
[52] U.S. Cl. ...................................... 365/204; 365/230.01
[58] Field of Search ............................. 365/204, 230.01, 365/230.06, 200

[56] References Cited

U.S. PATENT DOCUMENTS 4,896,300  1/1990  Shinagawa et al. ..................... 365/204
4,951,259  8/1990  Sato et al. ............................... 365/204
5,420,821  5/1995  Rhee ....................................... 365/204

Primary Examiner—David C. Nelms
Assistant Examiner—Michael T. Tran
Attorney, Agent, or Firm—Nikaido Marmelstein Murray & Oram, LLP.

[57]  ABSTRACT

A semiconductor memory device includes a plurality of memory cells coupled to word lines having a first end and a second end opposite to the first end, a word line driving circuit, and a word line resetting circuit. The word line driving circuit has at least one p-channel field effect transistor which is located in a vicinity of the first end of the word lines and drives a corresponding one of the word lines. On the other hand, the word line resetting circuit has at least one n-channel field effect transistor which is located in a vicinity of the second end of the word lines and resets a corresponding one of the word lines.

14 Claims, 8 Drawing Sheets

SEMICONDUCTOR MEMORY DEVICE HAVING P-CHANNEL FIELD EFFECT TRANSISTOR TO DRIVE WORD LINE This application is a continuation of application Ser. No. 08/622,297 filed Mar. 25, 1996, now abandoned.

BACKGROUND OF THE INVENTION

The present invention generally relates to semiconductor memory devices, and more particularly to a semiconductor memory device which uses P-channel field effect transistors to drive word lines.

FIG. 1 shows the construction of a portion of a dynamic random access memory (DRAM) as one example of a conventional semiconductor memory device. The DRAM shown in FIG. 1 includes a cell array region 1 having memory cells arranged in an array, a word line 2 which selects a memory cell, a word line driving circuit 3 which drives the word line 2, an inverter 4, and n-channel metal oxide semiconductor (nMOS) transistors 5 through 7 which are connected as shown.

In FIG. 1, WDZ and SELX respectively denote a word line driving signal and a word line selection signal. The word line driving signal WDZ has a low potential equal to a ground voltage Vss, and a high potential equal to a voltage Vpp which is obtained by boosting a power supply voltage Vcc. On the other hand, the word line selection signal SELX has a low potential equal to the ground voltage Vss, and a high potential equal to the power supply voltage Vcc. In addition, VSRZ denotes a fixed voltage which is less than or equal to Vcc+Vth, where Vth denotes a threshold voltage of the nMOS transistor 5.

FIG. 2 is a timing chart for explaining the selection operation of the word line 2 in the DRAM shown in FIG. 1. FIG. 2 shows a voltage waveform SELX of the word line selection signal SELX, a voltage waveform WDZ of the word line driving signal WDZ, a voltage waveform N8 of a node 8 shown in FIG. 1, and a voltage waveform WL2 of the word line 2.

When the word line 2 is not selected in the DRAM shown in FIG. 1, word line selection signal SELX has a level Vcc, the word line driving signal WDZ has a level Vss, the inverter 4 has an output level Vss, the node 8 has a level Vss, the nMOS transistor 6 is OFF, the nMOS transistor 7 is ON, and the word line 2 has a level Vss.

When the word line 2 is selected from this state, the level of the word line selection signal SELX is lowered to the level Vss, the nMOS transistor 7 is turned OFF, the output level of the inverter 4 is raised to Vcc, and the node 8 is precharged to a level Vcc-α by the nMOS transistor 5.

Next, the level of the word line driving signal WDZ is raised to a level Vpp. In this case, a channel is formed in the nMOS transistor 6, and thus, the voltage at the node 8 is self-boosted by the channel-gate capacitance of the nMOS transistor 6 and is raised to a level Vpp+α. As a result, the voltage of the word line 2 follows that of the word line driving signal WDZ and rises to the level Vpp.

Thereafter, when resetting the word line 2, the level of the word line driving signal WDZ is lowered towards Vss, and the charge accumulated in the word line 2 is discharged towards the word line driving signal line via the nMOS transistor 6. Hence, the voltage of the word line 2 starts to follow the word line driving signal WDZ and fall.

In addition, when the level of the word line driving signal WDZ becomes Vss, the level of the word line selection signal SELX is then raised to Vcc. As a result, the output level of the inverter 4 becomes Vss, and the charge accumulated at the node 8 is discharged towards the ground via the nMOS transistor 5 and the inverter 4. Accordingly, the level of the node 8 becomes Vss, and the nMOS transistor 6 is turned OFF.

In this case, the nMOS transistor 7 is ON, and the charge remaining in the word line 2 is discharged towards the ground via the nMOS transistor 7, thereby making the level of the word line 2 Vss.

However, according to the DRAM shown in FIG. 1, a voltage level exceeding Vpp is applied to a junction between a P-type well and an N-type diffusion layer forming a source or drain of the nMOS transistor 5 on the side of the node 8. For this reason, there was a problem in that the reliability of the DRAM deteriorates as the integration density of the DRAM increases.

In order to eliminate this problem, a DRAM having a portion with the construction shown in FIG. 3 has been proposed. The portion of this DRAM shown in FIG. 3 includes a cell array region 10 having memory cells arranged in an array, a word line 11, a word line driving circuit 12 which drives the word line 11, a p-channel metal oxide semiconductor (pMOS) transistor 13, nMOS transistors 14 and 15, and a wiring resistance 16 between the word line 11 and a drain of the nMOS transistor 14.

FIG. 4 is a timing chart for explaining the selection operation of the word line 11 in the DRAM shown in FIG. 3. FIG. 4 shows a voltage waveform SELX of the word line selection signal SELX, and a voltage waveform WL11 of the word line 11.

When the word line 11 is not selected in the DRAM shown in FIG. 3, the word line selection signal SELX has the level Vpp, the pMOS transistor 13 is OFF, the nMOS transistor 15 is ON, and the word line 11 has the level Vss.

When the word line 11 is selected from this state, the level of the word line selection signal SELX is lowered to Vss, the pMOS transistor 13 is turned ON, and the nMOS transistor 15 is turned OFF. In addition, the voltage level of the word line 11 is raised to Vpp via the PMOS transistor 13.

Thereafter, when resetting the word line 11, the level of the word line selection signal SELX is raised to Vpp, the pMOS transistor 13 is turned OFF, and the NMOS transistor 15 is turned ON. In addition, the charge accumulated in the word line 11 is discharged towards the ground via the nMOS transistors 14 and 15, and the voltage level of the word line 11 is lowered to Vss.

Hence, the DRAM shown in FIG. 3 does not have a junction which is raised to a potential level greater than Vpp. For this reason, it is possible to maintain the reliability of the DRAM even when the integration density of the DRAM is increased.

But in order to realize a high-speed access in the DRAM shown in FIG. 3 and to raise the level of the word line 11 at a high speed, it is necessary to arrange the PMOS transistor 13 at a position close to the cell array region 10. For this reason, the nMOS transistors 14 and 15 are inevitably arranged at positions far away from the word line 11 relative to the PMOS transistor 13.

The above arrangement, however, increases the length of the wiring connecting the word line 11 and the drain of the nMOS transistor 14, thereby increasing the wiring resistance 16. As a result, there were problems in that the lowering of the level of the word line 11 is considerably delayed by the large wiring resistance 16, and that the word line 11 cannot be reset at a high speed.

On the other hand, if the nMOS transistors 14 and 15 were arranged at positions near the cell array region 10 and the pMOS transistor 13 were arranged at a position far away from the cell array region 10 relative to the cell array region 10, it would be possible to reset the word line 11 at a high speed, but the raising of the level of the word line 11 would be considerably delayed, thereby making it impossible to realize a high-speed access.

SUMMARY OF THE INVENTION

Accordingly, it is a general object of the present invention to provide a novel and useful semiconductor memory device in which the problems described above are eliminated.

Another and more specific object of the present invention is to provide a semiconductor memory device which prevents formation of a junction which is applied with a voltage exceeding a boosted voltage so that it is possible to realize a high-speed access and to reset a word line at a high speed without deteriorating the reliability even when the integration density of the semiconductor memory device is increased.

Still another object of the present invention is to provide a semiconductor memory device comprising a plurality of memory cells coupled to word lines having a first end and a second end opposite to the first end, a word line driving circuit having at least one p-channel field effect transistor which is located in a vicinity of the first end of the word lines and drives a corresponding one of the word lines, and a word line resetting circuit having at least one n-channel field effect transistor which is located in a vicinity of the second end of the word lines and resets a corresponding one of the word lines. According to the semiconductor memory device of the present invention, it is possible to prevent formation of a junction which is applied with a voltage which exceeds a boosted voltage, because the word line is driven, that is, the level of the word line is raised, using the p-channel field effect transistor. In addition, because the word line driving circuit is provided on the first end of the word lines and the word line reset circuit is provided on the second end of the word lines, it is possible to prevent a large wiring resistance from being formed between word lines and the p-channel field effect transistors which drive the word lines, and between the word lines and the n-channel field effect transistors which reset the word lines. Accordingly, it is possible to drive the word lines at a high speed, that is, raise the levels of the word lines at a high speed, and also realize a high-speed access to the memory cells of the DRAM.

Other objects and further features of the present invention will be apparent from the following detailed description when read in conjunction with the accompanying drawings.

DESCRIPTION OF THE PREFERRED EMBODIMENTS

A description will be given of an embodiment of a semiconductor memory device according to the present invention, by referring to FIGS. 5 through 8.

Figure 1:
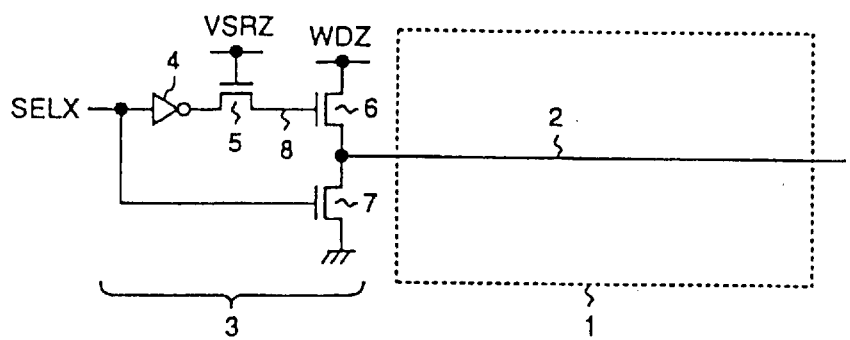
FIG. 1 is a circuit diagram showing the construction of a portion of an example of a conventional DRAM.
Figure 2:
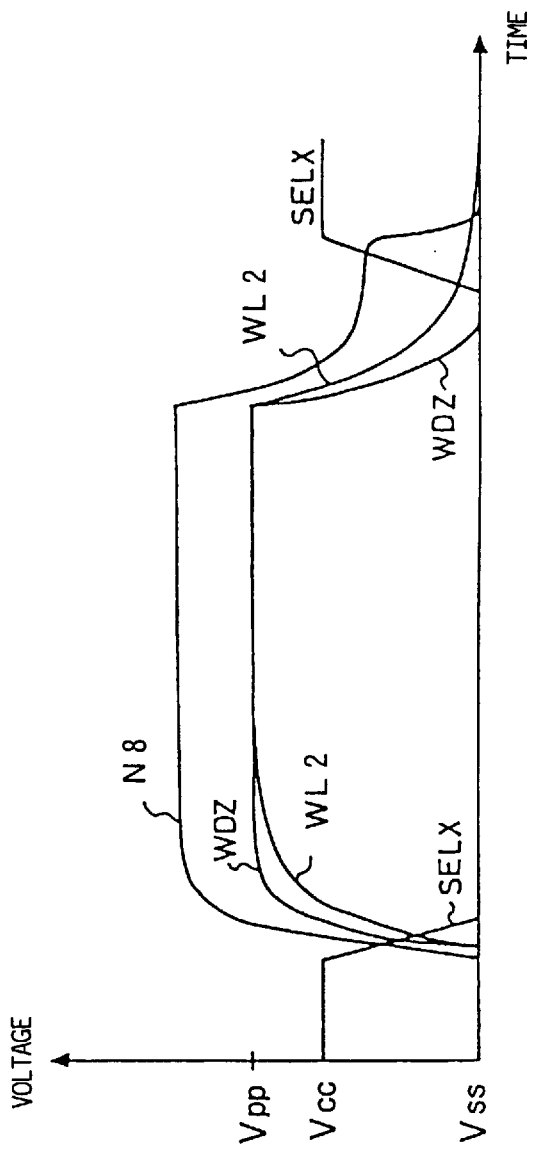
FIG. 2 is a timing chart for explaining the selection operation of a word line in the conventional DRAM shown in FIG. 1.
Figure 3:
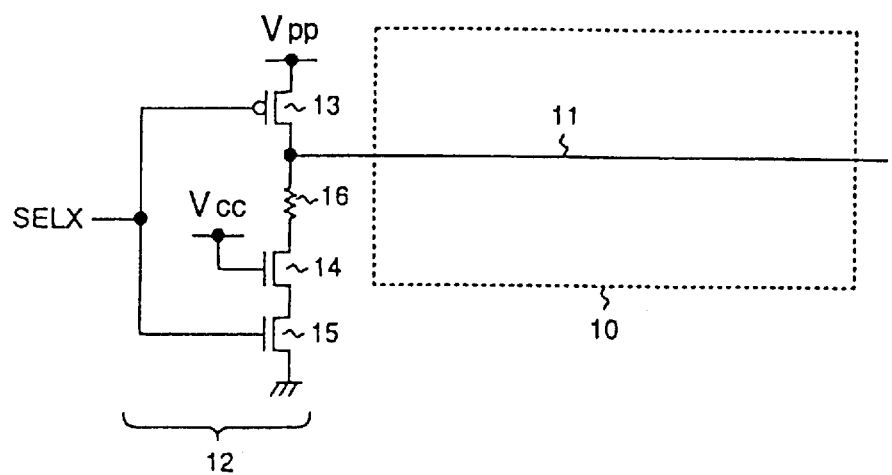
FIG. 3 is a circuit diagram showing the construction of a portion of another example of the conventional DRAM.
Figure 4:
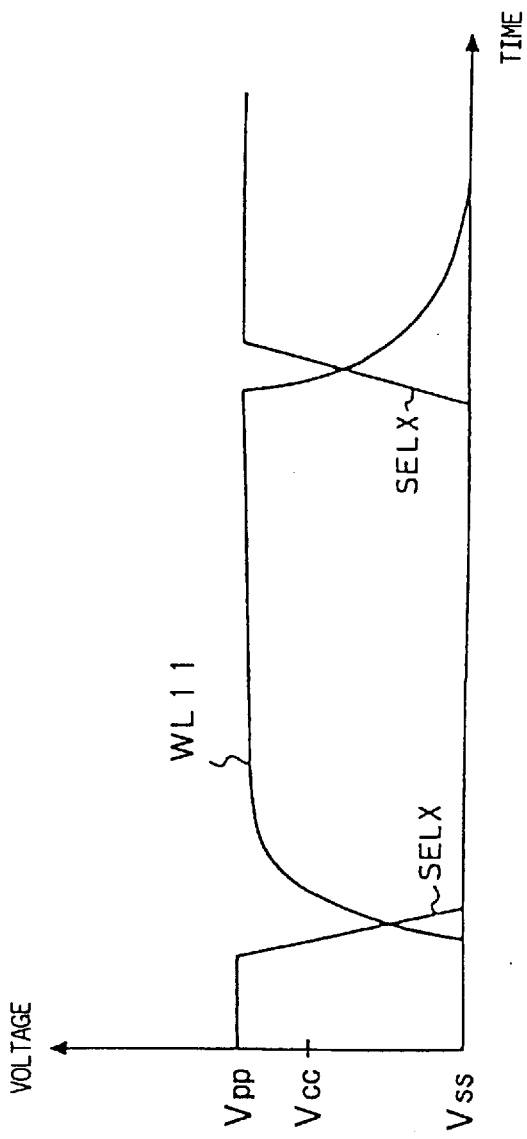
FIG. 4 is a timing chart for explaining the selection operation of a word line in the conventional DRAM shown in FIG. 3.
Figure 5:
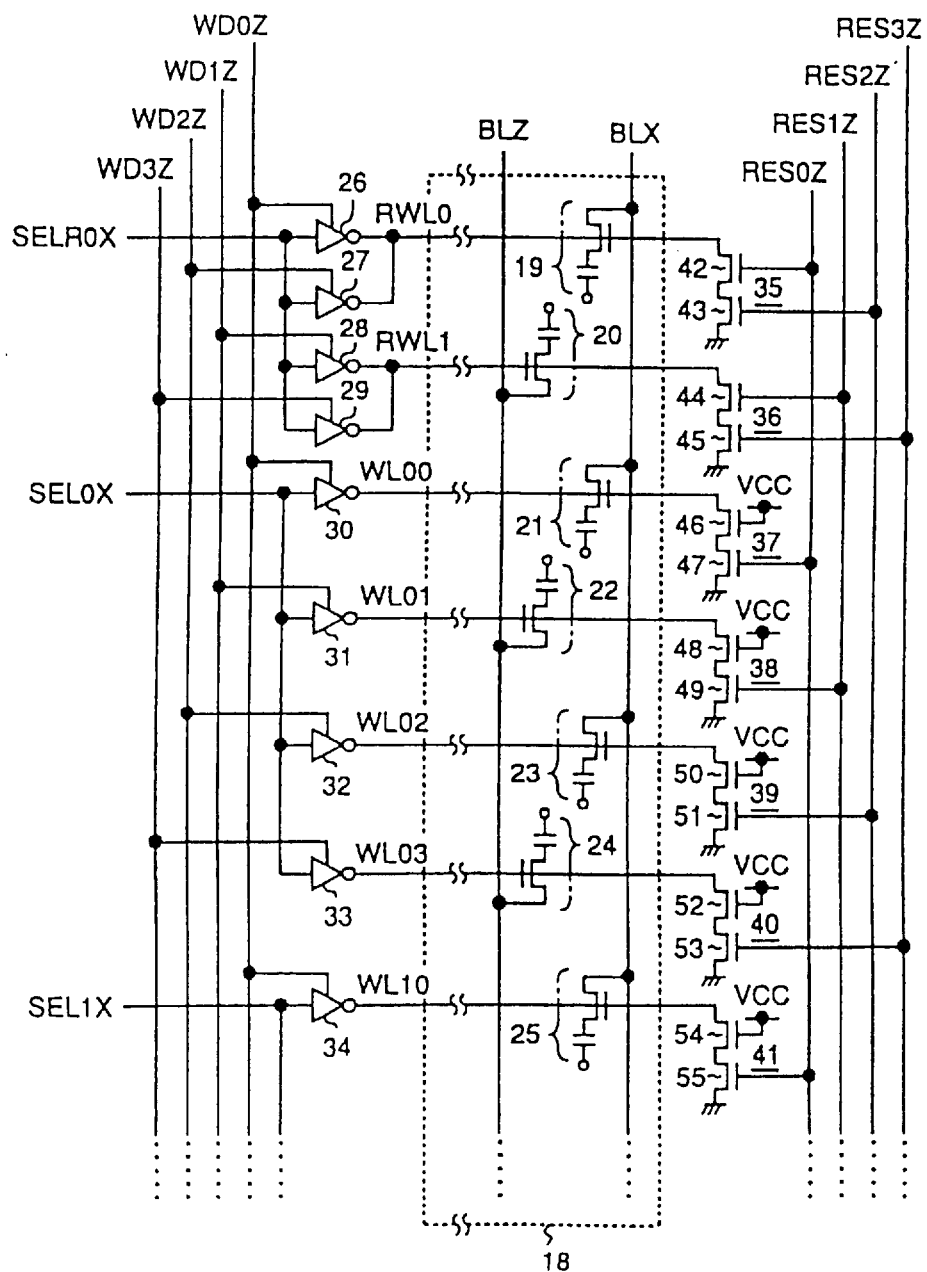
FIG. 5 is a circuit diagram showing the construction of a portion of an embodiment of a semiconductor memory device according to the present invention.

FIG. 5 is a circuit diagram showing the construction of a portion of the embodiment of the semiconductor memory device according to the present invention. In this embodiment, the present invention is applied to a DRAM.

The portion of the DRAM shown in FIG. 5 includes a cell array region 18, redundant word lines RWL0 and RWL1, normal word lines (hereinafter simply referred to as word lines) WL00, WL01, WL02, WL03 and WL10, bit lines BLX and BLZ, redundant memory cells 19 and 20 which are arranged within the cell array region 18, and normal memory cells (hereinafter simply referred to as memory cells) 21 through 25 which are arranged within the cell array region 18. In addition, the DRAM further includes redundant word line driving circuits 26 and 27 which drive the redundant word line RWL0, redundant word line driving circuits 28 and 29 which drive the redundant word line RWL1, a word line driving circuit 30 which drives the word line WL00, a word line driving circuit 31 which drives the word line WL01, a word line driving circuit 32 which drives the word line WL02, a word line driving circuit 33 which drives the word line WL03, and a word line driving circuit 34 which drives the word line WL10.

The DRAM also includes a redundant word line resetting circuit 35 which resets the redundant word line RWL0, a redundant word line resetting circuit 36 which resets the redundant word line RWL1, a word line resetting circuit 37 which resets the word line WL00, a word line resetting circuit 38 which resets the word line WL01, a word line resetting circuit 39 which resets the word line WL02, a word line resetting circuit 40 which resets the word line WL03, and a word line resetting circuit 41 which resets the word line WL10. The resetting circuits 35 through 41 are respectively made up of 2 corresponding nMOS transistors out of nMOS transistors 42 through 55.

Figure 6:
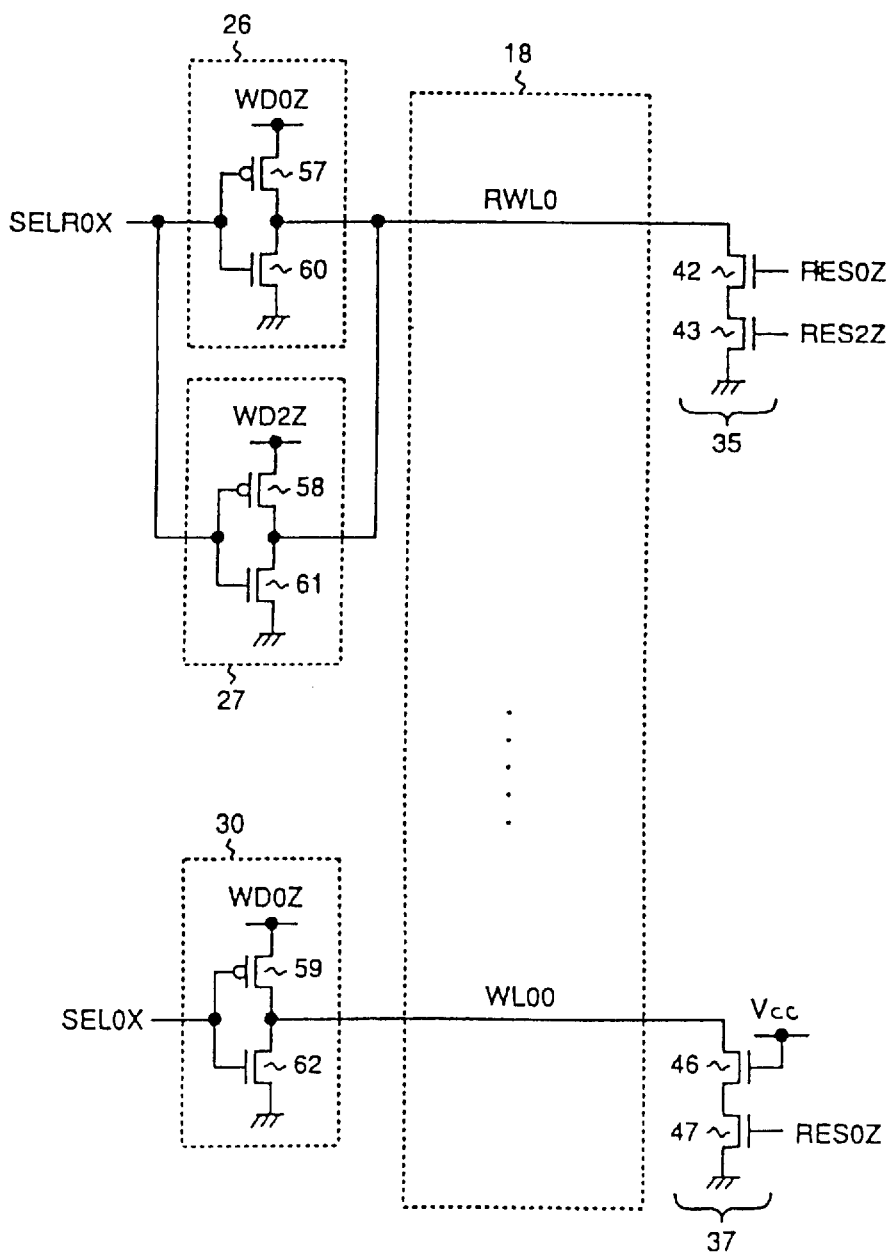
FIG. 6 is a circuit diagram showing an embodiment of the construction of a circuit portion including a redundant word line driving circuit and a word line driving circuit.

In FIG. 6, WD0Z through WD3Z denote word line driving signals, SEL0X and SEL1X denote word line selection signals, SELR0X denotes a redundant word line selection signal, and RES0Z through RES3Z denote word line reset signals.

The word line driving signals WD0Z through WD3Z, the word line selection signals SEL0X and SEL1X, and the redundant word line selection signal SELR0X have a low potential equal to a ground voltage Vss and a high potential equal to a boosted voltage Vpp which is obtained by boosting a power supply voltage Vcc. The word line reset signals RES0Z through RES3Z respectively have a low potential equal to the ground voltage Vss and a high potential equal to the power supply voltage Vcc.

FIG. 6 is a circuit diagram showing an embodiment of the construction of a circuit portion including the redundant word line driving circuits 26 and 27 and the word line driving circuit 30 shown in FIG. 5. The circuit portion shown in FIG. 6 includes pMOS transistors 57 through 59 and nMOS transistors 60 through 62 which are connected as shown.

The other redundant word line driving circuits 28 and 29 and the word line driving circuits 31 through 34 have a construction similar to that of the corresponding part of the circuit portion shown in FIG. 6. In addition, although FIGS. 5 and 6 are circuit diagrams, FIGS. 5 and 6 also show the general arrangement of elements of the DRAM in the plan view, as will be described later.

For example, row addresses RA0 through RA4 of the word line WL00 are set to "00000", and the row addresses RA0 through RA4 of the word line WL01 are set to "10000". In addition, the row addresses RA0 through RA4 of the word line WL02 are set to "01000", and the row addresses RA0 through RA4 of the word line WL03 are set to "11000". In other words, when n is an integer and i=0, 1, . . . , n, the row addresses RA0 differ between the word lines WLi0 and WLi1, but the row addresses of the word lines WLi0 and WLi1 are the same. In addition, the row addresses RA0 differ between the word lines WLi2 and WLi3, but the row addresses of the word lines WLi2 and WLi3 are the same.

In this embodiment, if no defect exists in the memory cells including the memory cells 21 through 25 and the redundant memory cells including the redundant memory cells 19 and 20 are not used, the word line reset signal RES0Z first falls and the word line driving signal WD0Z then rises when the row addresses RA0 and RA1 are specified as "00".

In addition, when the row addresses RA0 and RA1 are specified as "10", the word line reset signal RES1Z first falls and the word line driving signal WD1Z then rises.

When the row addresses RA0 and RA1 are specified as "01", the word line reset signal RES2Z first falls and the word line driving signal WD2Z then rises.

Furthermore, when row addresses RA0 and RA1 are specified as "11", the word line reset signal RES3Z first falls and the word line driving signal WD3Z then rises.

On the other hand, when the redundant memory cells are used in this embodiment, the word lines WLi0 and WLi1 or the word lines WLi2 and WLi3 are replaced by the redundant word lines RWL0 and RWL1. If the redundant memory cells are used, the word line reset signal RES0Z first falls and the word line driving signals WD0Z and WD2Z when the row addresses RA0 and RA1 are specified as "00".

In addition, when the row addresses RA0 and RA1 are specified as "10", the word line reset signal RES1Z first falls and the word line driving signals WD1Z and WD3Z then rise.

When the row addresses RA0 and RA1 are specified as "01", the word line reset signal RES2Z first falls and the word line driving signals WD0Z and WD2Z then rise.

Furthermore, when row addresses RA0 and RA1 are specified as "11", the word line reset signal RES3Z first falls and the word line driving signals WD1Z and WD3Z then rise.

Figure 7:
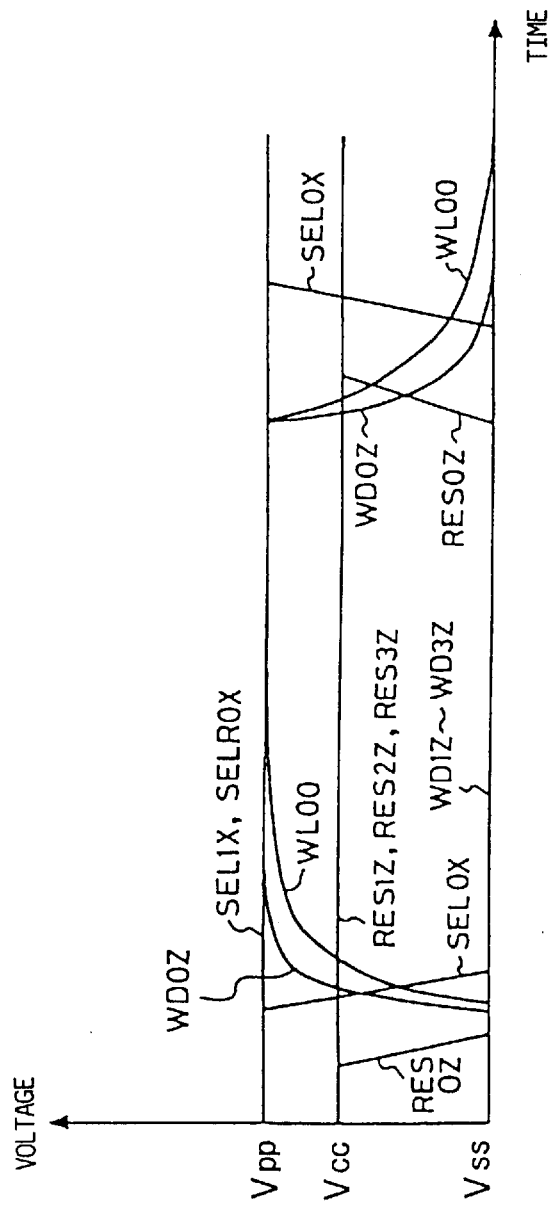
FIG. 7 is a timing chart for explaining the operation of the embodiment when a word line is selected in a case where no redundant memory cell is used.

FIG. 7 is a timing chart for explaining the operation of the DRAM when the word line WL00 is selected in a case where no redundant memory cell is used. FIG. 7 shows voltage waveforms RES0Z through RES3Z of the word line reset signals RES0Z through RES3Z, voltage waveforms SEL0X and SEL1X of the word line selection signals SEL0X and SEL1X, a voltage waveform WD0Z of the word line driving signal WD0Z, a voltage waveform SELR0X of the redundant word line selection signal SELR0X, and a voltage waveform WL00 of the word line WL00.

In this case, when the word line WL00 is not selected, the word line selection signals SEL0X and SEL1X and the redundant word line selection signal SELR0X have a level Vpp, the word line reset signals RES0Z through RES3Z have a level Vcc, and the word line driving signal WD0Z has a level Vss. For this reason, in the redundant word line driving circuits 26 through 29 and the word line driving circuits 30 through 34, the PMOS transistors turn OFF and the NMOS transistors turn ON. In addition, in the redundant word line resetting circuits 35 and 36 and the word line resetting circuits 37 through 41, the nMOS transistors 42 through 55 turn ON and the levels of the redundant word lines RWL0 and RWL1 and the word lines WL00 through WL03 and WL10 become Vss.

When the word line WL00 is selected from this state, the row addresses RA0 and RA1 are specified as "00" and the level of the word line reset signal RES0Z is lowered to Vss. As a result, the nMOS transistor 42 of the redundant word line resetting circuit 35 and the nMOS transistors 47 and 55 of the word line resetting circuits 37 and 41 turn OFF.

Next, the level of the word line selection signal SEL0X is lowered to Vss and the level of the word line driving signal WD0Z is raised to Vpp. Hence, in the word line driving circuit 30, the pMOS transistor 59 turns ON, the nMOS transistor 62 turns OFF, and the level of the word line WL00 follows that of the word line driving signal WD0Z and rises to Vpp.

When resetting the word line WL00, the level of the word line reset signal RES0Z is raised to Vcc and the level of the word line driving signal WD0Z is lowered to Vss. As a result, the charge accumulated in the word line WL00 is discharged towards the word line driving signal line via the pMOS transistor 59 of the word line driving circuit 30, and is also discharged toward the ground via the nMOS transistors 46 and 47 of the word line resetting circuit 37. Accordingly, the level of the word line WL00 falls towards Vss.

When the level of the word line WL00 becomes less than or equal to Vcc, the level of the word line selection signal SEL0X is raised to Vpp, and in the word line driving circuit 30, the PMOS transistor 59 turns OFF and the nMOS transistor 62 turns ON. Thus, the charge remaining in the word line WL00 is discharge towards the ground via the nMOS transistor 62 of the word line driving circuit 30 and the nMOS transistors 46 and 47 of the word line resetting circuit 37. Consequently, the level of the word line WL00 is lowered to Vss and is clamped to Vss.

Figure 8:
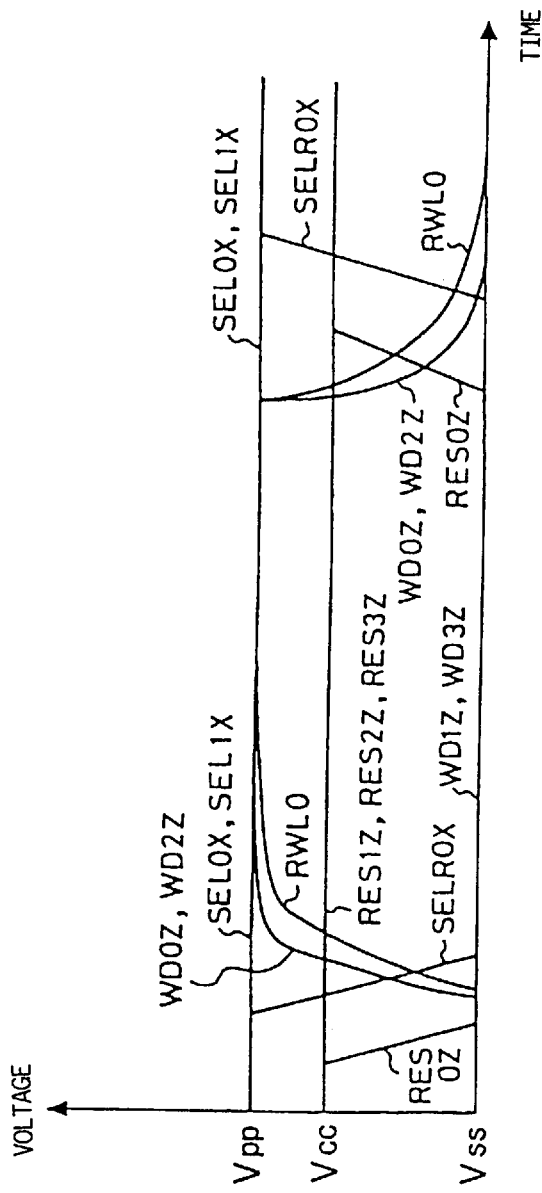
FIG. 8 is a timing chart for explaining the operation of the embodiment when the word line is selected in a case where the word line is replaced by a redundant word line.

FIG. 8 is a timing chart for explaining the operation of the DRAM when the word line WL00 is selected in a case where the word lines WL00 and WL01 are replaced by the redundant word lines RWL0 and RWL1. FIG. 8 shows voltage waveforms RES0Z through RES3Z of the word line reset signals RES0Z through RES3Z, voltage waveforms SEL0X and SEL1X of the word line selection signals SEL0X and SEL1X, voltage waveforms WD0Z through WD3Z of the word line driving signals WD0Z through WD3Z, a voltage waveform SELR0X of the redundant word line selection signal SELR0X, and a voltage waveform RWL0 of the redundant word line RWL0.

In this case also, when the word line WL00 is not selected, the word line selection signals SEL0X and SEL1X and the redundant word line selection signal SELR0X have a level Vpp, the word line reset signals RES0Z through RES3Z have a level Vcc, and the word line driving signals WD0Z through WD3Z have a level Vss. For this reason, in the redundant word line driving circuits 26 through 29 and the word line driving circuits 30 through 34, the PMOS transistors are turned OFF and the nMOS transistors are turned ON. In addition, in the redundant word line resetting circuits 35 and 36 and the word line resetting circuits 37 through 41, the nMOS transistors 42 through 55 are turned ON and the levels of the redundant word lines RWL0 and RWL1 and the word lines WL00 through WL03 and WL10 become Vss.

When the word line WL00 is selected from this state, the row addresses RA0 and RA1 are specified as "00", and the level of the word line reset signal RES0Z is lowered to Vss. As a result, the nMOS transistor 42 of the redundant word line resetting circuit 35 and the nMOS transistors 47 and 55 of the word line resetting circuits 37 and 41 are turned OFF.

Next, the level of the redundant word line selection signal SELR0X is lowered to Vss, and the levels of the word line driving signals WD0Z and WD2Z are raised to Vpp. Hence, in the redundant word line selection circuits 26 and 27, the pMOS transistors 57 and 58 turn ON and the nMOS transistors 60 and 61 turn OFF. In addition, the level of the redundant word line RWL0 follows those of the word line driving signals WD0Z and WD2Z and rises to Vpp.

When resetting the word line WL00, the level of the word line reset signal RES0Z is raised to Vcc and the levels of the word line driving signals WD0Z and WD2Z are lowered towards Vss. As a result, the charge accumulated in the redundant word line RWL0 is discharged towards the word line driving signal lines via the PMOS transistors 57 and 58 of the redundant word line driving circuits 26 and 27, and is also discharged towards the ground via the nMOS transistors 42 and 43 of the redundant word line resetting circuit 35. Further, the level of the redundant word line RWL0 is lowered towards Vss.

When the level of the redundant word line RWL0 becomes less than or equal to Vcc, the level of the redundant word line selection signal SELR0X is raised to Vpp. In addition, in the redundant word line driving circuits 26 and 27, the pMOS transistors 57 and 58 are turned OFF and the nMOS transistors 60 is turned ON. For this reason, the charge remaining in the redundant word line RWL0 is discharged towards the ground via the nMOS transistors 60 and 61 of the redundant word line driving circuits 26 and 27 and the nMOS transistors 42 and 43 of the redundant word line resetting circuit 35. Moreover, the level of the redundant word line RWL0 is lowered to Vss and is clamped to Vss.

If the word line WL02 is selected in a case where the word lines WL02 and WL03 are replaced by the redundant word lines RWL0 and RWL1, the row addresses RA0 and RA1 are specified as "01", ad the level of the word line reset signal RES2Z is lowered to Vss. As a result, the nMOS transistor 43 of the redundant word line resetting circuit 35 and the nMOS transistor 51 of the word line resetting circuit 39 are turned OFF.

Next, the level of the redundant word line selection signal SELR0X is lowered to Vss, and the levels of the word line driving signal WD0Z and WD2Z are raised to Vpp. Hence, in the redundant word line driving circuits 26 and 27, the PMOS transistors 57 and 58 are turned ON and the nMOS transistors 60 and 61 are turned OFF. In addition, the level of the redundant word line RWL0 follows those of the word line driving signals WD0Z and WD2Z and rises to Vpp.

Then, when resetting the word line WL00, the level of the word line reset signal RES2Z is raised to Vcc, and the levels of the word line driving signals WD0Z and WD2Z are lowered towards Vss. As a result, the charge accumulated in the redundant word line RWL0 is discharged towards the word line driving signal lines via the pMOS transistors 57 and 58 of the redundant word line driving circuits 26 and 27, and is also discharged towards the ground via the nMOS transistors 42 and 43 of the redundant word line resetting circuit 35. In addition, the level of the redundant word line RWL0 is lowered towards Vss.

When the level of the redundant word line RWL0 becomes less than or equal to Vcc, the level of the redundant word line selection signal SELR0X is raised to Vpp. Further, in the redundant word line driving circuits 26 and 27, the pMOS transistors 57 and 58 are turned OFF and the nMOS transistors 60 and 61 are turned ON. Hence, the charge remaining in the redundant word line RWL0 is discharged towards the ground via the NMOS transistors 60 and 61 of the redundant word line driving circuits 26 and 27 and the nMOS transistors 42 and 43 of the redundant word line resetting circuit 35. Moreover, the level of the word line WL00 is lowered to Vss and is clamped to Vss.

Therefore, according to this embodiment, the word line or redundant word line is driven by use of pMOS transistors. For this reason, a junction applied with a voltage exceeding the boosted voltage Vpp will not be formed in the DRAM, and it is possible to prevent the reliability of the DRAM from deteriorating even when the integration density of the DRAM is increased.

It should also be noted that, in this embodiment, the pMOS transistors of the redundant word line driving circuits 26 through 29 and the word line driving circuits 30 through 34 can be arranged at positions close to the cell array region 18, and the nMOS transistors can be arranged at positions far away from the cell array region 18 relative to the PMOS transistors. By arranging the pMOS transistors and the nMOS transistors at such positions, it is possible to prevent a large wiring resistance from being formed between redundant word lines and the pMOS transistors which drive the redundant word lines, and between the word lines and the pMOS transistors which drive the word lines. Accordingly, it is possible to drive the redundant word lines and the word lines at a high speed, that is, raise the levels of the redundant word lines and the word lines at a high speed, and also realize a high-speed access to the memory cells of the DRAM.

Furthermore, in this embodiment, the redundant word line resetting circuits 35 and 36 and the word line resetting circuits 37 through 41 are provided on the right side of the redundant word lines RWL0 and RWL1 and the word lines WL00 through WL03 and WL10 in FIGS. 5 and 6, and the resetting of the redundant word lines RWL0 and RWL1 and the word lines WL00 through WL03 and WL10 is primarily carried out by the redundant word line resetting circuits 35 and 36 and the word line resetting circuits 37 through 41. For this reason, it is possible to prevent a large wiring resistance from being formed between the drains of the nMOS transistors 42, 44, 46, 48, 50, 52 and 54 and the redundant word lines RWL0 and RWL1 and the word lines WL00 through WL03 and WL10. As a result, it is possible to lower the levels of the redundant word lines RWL0 and RWL1 and the word lines WL00 through WL03 and WL10 at a high speed, and thus reset the redundant word lines at a high speed and reset the word lines at a high speed.

In other words, in this embodiment, the PMOS transistors or p-channel field effect transistors (FETs) of the redundant word line driving circuits 26 through 29 and the word line driving circuits 30 through 34 which drive and raise the levels of the corresponding redundant word lines RWL0 and RWL1 and word lines WL00 through WL03 and WL10 are arranged to the left of the redundant word lines RWL0 and RWL1 and the word lines WL00 through WL03 and WL10 with respect to the cell array region 18 in FIGS. 5 and 6. In addition, the nMOS transistors or n-channel FETs of the redundant word line resetting circuits 35 and 36 and the word line resetting circuits 37 through 41 which reset and lower the levels of the corresponding redundant word lines RWL0 and RWL1 and word lines WL00 through WL03 and WL10 are arranged to the right of the redundant word lines RWL0 and RWL1 and the word lines WL00 through WL03 and WL10 with respect to the cell array region 18. Although FIGS. 5 and 6 are circuit diagrams, FIGS. 5 and 6 also show the general arrangement of elements of the DRAM in the plan view. Accordingly, it is possible to prevent a junction which is applied with a voltage exceeding the boosted voltage Vpp from being formed in the DRAM, and it is possible to prevent the reliability of the DRAM from deteriorating even when the integration density of the DRAM is increased. In addition, by employing such arrangements of the p-channel and n-channel FETs, it is possible to prevent a large wiring resistance from being formed between redundant word lines and the p-channel FETs which drive and raise the level of the redundant word lines, and between the word lines and the p-channel FETs which drive and raise the level of the word lines. Therefore, it is possible to drive the redundant word lines and the word lines at a high speed, that is, raise the levels of the redundant word lines and the word lines at a high speed, and also reset the redundant word lines and the word lines at a high speed, thereby making it possible to realize a high-speed access to the memory cells of the DRAM.

Further, the present invention is not limited to these embodiments, but various variations and modifications may be made without departing from the scope of the present invention.

What is claimed is:

1. A semiconductor memory device comprising:
   a plurality of memory cells coupled to word lines having a first end and a second end opposite to the first end;
   a word line driving circuit having at least one p-channel field effect transistor which is located in a vicinity of the first end of the word lines and which drives a corresponding one of the word lines in response to a word line selection signal, said at least one p-channel field effect transistor is not responsive to a level of the word line; and
   a word line resetting circuit having at least one n-channel field effect transistor which is located in a vicinity of the second end of the word lines and which resets a corresponding one of the word lines in response to a word line reset signal.

2. The semiconductor memory device as claimed in claim 1, wherein said p-channel field effect transistor has a drain coupled to said corresponding one of the word lines, a source which is applied with a predetermined word line selection signal out of a group of first word line selection signals, and a gate which is applied with a predetermined word line selection signal out of a group of second word line selection signals.

3. The semiconductor memory device as claimed in claim 2, wherein said word line driving circuit includes at least one n-channel field effect transistor having a drain coupled to a corresponding one of the word lines, a source that is grounded, and a gate which is applied with the predetermined word line selection signal that is applied to the gate of said p-channel field effect transistor.

4. The semiconductor memory device as claimed in claim 1, wherein said word line resetting circuit comprises:
   a first n-channel field effect transistor having a drain which is coupled to a corresponding one of the word lines, a source, and a gate which is applied with a power supply voltage; and
   a second N-channel field effect transistor having a drain coupled to the source of said first n-channel field effect transistor, a source that is grounded, and a gate which is applied with a predetermined word line reset signal out of a group of word line reset signals.

5. The semiconductor memory device as claimed in claim 2, wherein said word line resetting circuit comprises:
   a first n-channel field effect transistor having a drain which is coupled to a corresponding one of the word lines, a source, and a gate which is applied with a power supply voltage; and
   a second N-channel field effect transistor having a drain coupled to the source of said first n-channel field effect transistor, a source that is grounded, and a gate which is applied with a predetermined word line reset signal out of a group of word line reset signals.

6. The semiconductor memory device as claimed in claim 3, wherein said word line resetting circuit comprises:
   a first n-channel field effect transistor having a drain which is coupled to a corresponding one of the word lines, a source, and a gate which is applied with a power supply voltage; and
   a second N-channel field effect transistor having a drain coupled to the source of said first n-channel field effect transistor, a source that is grounded, and a gate which is applied with a predetermined word line reset signal out of a group of word line reset signals.

7. The semiconductor memory device as claimed in claim 2, which further comprises:
   a plurality of redundant memory cells coupled to redundant word lines having a first end and a second end opposite to the first end;
   a first redundant word line driving circuit including a first redundant p-channel field effect transistor having a drain which is coupled to a corresponding one of the redundant word lines, a source which is applied with a first predetermined word line selection signal out of the group of first word line selection signals, and a gate which is applied with a redundant word line selection signal;
   a second redundant word line driving circuit including a second redundant p-channel field effect transistor having a drain which is coupled to said corresponding one of the redundant word lines, a source which is applied with a second predetermined word line selection signal out of the group of first word line selection signals, and a gate which is applied with the redundant word line selection signal; and
   a redundant word line resetting circuit including:
      a first redundant n-channel field effect transistor having a drain coupled to said corresponding one of the redundant word lines, a source, and a gate which is applied with a first predetermined word line reset signal out of a group of word line reset signals; and
      a second redundant n-channel field effect transistor having a drain which is coupled to the source of the first redundant n-channel field effect transistor, a source that is grounded, and a gate which is applied with a second predetermined word line reset signal out of the group of word line reset signals, said first and second redundant word line driving circuits being located in a vicinity of the first end of the redundant word lines, said redundant word line resetting circuit being located in a vicinity of the second end of the redundant word lines.

8. The semiconductor memory device as claimed in claim 3, which further comprises:

a plurality of redundant memory cells coupled to redundant word lines having a first end and a second end opposite to the first end;

a first redundant word line driving circuit including a first redundant p-channel field effect transistor having a drain which is coupled to a corresponding one of the redundant word lines, a source which is applied with a first predetermined word line selection signal out of the group of first word line selection signals, and a gate which is applied with a redundant word line selection signal;

a second redundant word line driving circuit including a second redundant p-channel field effect transistor having a drain which is coupled to said corresponding one of the redundant word lines, a source which is applied with a second predetermined word line selection signal out of the group of first word line selection signals, and a gate which is applied with the redundant word line selection signal; and a redundant word line resetting circuit including:

a first redundant n-channel field effect transistor having a drain coupled to said corresponding one of the redundant word lines, a source, and a gate which is applied with a first predetermined word line reset signal out of a group of word line reset signals; and a second redundant n-channel field effect transistor having a drain which is coupled to the source of the first redundant n-channel field effect transistor, a source that is grounded, and a gate which is applied with a second predetermined word line reset signal out of the group of word line reset signals, said first and second redundant word line driving circuits being located in a vicinity of the first end of the redundant word lines, said redundant word line resetting circuit being located in a vicinity of the second end of the redundant word lines.

9. The semiconductor memory device as claimed in claim 4, which further comprises:

a plurality of redundant memory cells coupled to redundant word lines having a first end and a second end opposite to the first end;

a first redundant word line driving circuit including a first redundant p-channel field effect transistor having a drain which is coupled to a corresponding one of the redundant word lines, a source which is applied with a first predetermined word line selection signal out of the group of first word line selection signals, and a gate which is applied with a redundant word line selection signal;

a second redundant word line driving circuit including a second redundant p-channel field effect transistor having a drain which is coupled to said corresponding one of the redundant word lines, a source which is applied with a second predetermined word line selection signal out of the group of first word line selection signals, and a gate which is applied with the redundant word line selection signal; and a redundant word line resetting circuit including:

a first redundant n-channel field effect transistor having a drain coupled to said corresponding one of the redundant word lines, a source, and a gate which is applied with a first predetermined word line reset signal out of a group of word line reset signals; and a second redundant n-channel field effect transistor having a drain which is coupled to the source of the first redundant n-channel field effect transistor, a source that is grounded, and a gate which is applied with a second predetermined word line reset signal out of the group of word line reset signals, said first and second redundant word line driving circuits being located in a vicinity of the first end of the redundant word lines, said redundant word line resetting circuit being located in a vicinity of the second end of the redundant word lines.

10. The semiconductor memory device as claimed in claim 7, wherein each of said first and second redundant word line driving circuits further includes a redundant n-channel field effect transistor having a source that is grounded, a drain which is coupled to said corresponding one of the redundant word lines, and a gate which is applied with said redundant word line selection signal.

11. The semiconductor memory device as claimed in claim 8, wherein each of said first and second redundant word line driving circuits further includes a redundant n-channel field effect transistor having a source that is grounded, a drain which is coupled to said corresponding one of the redundant word lines, and a gate which is applied with said redundant word line selection signal.

12. The semiconductor memory device as claimed in claim 9, wherein each of said first and second redundant word line driving circuits further includes a redundant n-channel field effect transistor having a source that is grounded, a drain which is coupled to said corresponding one of the redundant word lines, and a gate which is applied with said redundant word line selection signal.

13. The semiconductor memory device as claimed in claim 1, which further comprises:

a cell array region in which the memory cells are arranged in an array, said first and second ends of the word lines corresponding to opposite sides of said cell array region.

14. The semiconductor memory device as claimed in claim 7, which further comprises:

a cell array region in which the memory cells and the redundant memory cells are arranged in an array, said first and second ends of the word lines respectively matching said first and second ends of the redundant word lines and corresponding to opposite sides of said cell array region.

* * * * *